(12) United States Patent
Krause et al.

(10) Patent No.: US 9,447,516 B2
(45) Date of Patent: Sep. 20, 2016

(54) METHOD FOR MANUFACTURING A SILICON MONOCRYSTAL SEED AND A SILICON-WAFER, SILICON-WAFER AND SILICON SOLAR-CELL

(71) Applicant: SOLARWORLD INNOVATIONS GMBH, Freiberg (DE)

(72) Inventors: Andreas Krause, Radebeul (DE); Juliane Walter, Halsbrucke (DE); Lamine Sylla, Dresden (DE)

(73) Assignee: SOLARWORLD INNOVATIONS GMBH, Freiberg (DE)

( * ) Notice: Subject to any disclaimer, the term of this patent is extended or adjusted under 35 U.S.C. 154(b) by 420 days.

(21) Appl. No.: 14/030,469

(22) Filed: Sep. 18, 2013

(65) Prior Publication Data
US 2014/0096822 A1 Apr. 10, 2014

(30) Foreign Application Priority Data
Oct. 5, 2012 (DE) .................. 10 2012 218 229

(51) Int. Cl.
*C30B 11/04* (2006.01)
*C30B 11/14* (2006.01)
*H01L 31/0224* (2006.01)
*H01L 31/028* (2006.01)
*H01L 31/036* (2006.01)
*C30B 29/06* (2006.01)
*H01L 31/18* (2006.01)
*C30B 13/00* (2006.01)
*C30B 15/00* (2006.01)

(52) U.S. Cl.
CPC .............. *C30B 11/14* (2013.01); *C30B 29/06* (2013.01); *H01L 31/028* (2013.01); *H01L 31/022441* (2013.01); *H01L 31/036* (2013.01); *H01L 31/1804* (2013.01); *C30B 13/00* (2013.01); *C30B 15/00* (2013.01); *Y02E 10/547* (2013.01); *Y02P 70/521* (2015.11)

(58) Field of Classification Search
CPC ........ C30B 29/06; C30B 11/02; C30B 11/14
See application file for complete search history.

(56) References Cited

U.S. PATENT DOCUMENTS

2010/0192838 A1 8/2010 Stoddard
2011/0297223 A1 12/2011 Krause et al.

FOREIGN PATENT DOCUMENTS

DE  10 2010 029 741 A1  12/2011

OTHER PUBLICATIONS

Apr. 11, 2016 Notice of Allowance issued in Taiwanese Patent Application No. 102135821.

*Primary Examiner* — Robert M Kunemund
(74) *Attorney, Agent, or Firm* — Oliff PLC

(57) ABSTRACT

Within the scope of a Silicon-wafer making, in which a silicon monocrystal seed is arranged in the bottom region of a crucible, wherein the silicon monocrystal seed has a seed surface with a {110}-crystal orientation parallel to the bottom region of the crucible, in which liquid high-purity silicon is solidified, starting from the seed surface of the silicon monocrystal seed, and in which the silicon block is split into Silicon-wafers in such a manner that a wafer surface has a {100}-crystal orientation, wherein the silicon monocrystal seed is manufactured from a silicon monocrystal block, the block axis of which has a [110]-spatial orientation, wherein the silicon monocrystal block is cut-off for forming the seed surface of the silicon monocrystal seed with the {110}-crystal orientation parallel to the block axis.

11 Claims, 4 Drawing Sheets

METHOD FOR MANUFACTURING A SILICON MONOCRYSTAL SEED AND A SILICON-WAFER, SILICON-WAFER AND SILICON SOLAR-CELL

The invention relates to a method for manufacturing a silicon monocrystal seed and a Silicon-wafer, a Silicon-wafer and a silicon solar-cell.

Solar-cells are generally made of silicon, wherein monocrystalline as well as polycrystalline silicon slices are used for making solar-cells. Monocrystalline silicon cells have a substantially higher efficiency as compared to the polycrystalline silicon cells, however are more energy intensive and comparatively expensive in the production. During the manufacture of monocrystalline silicon slices, at first, crystals of high-purity silicon are produced, which are then split into thin slices—also known as wafer, generally by means of a wire sawing process. Standard method during the manufacture of monocrystalline Silicon-wafer is the Czochralski method, in which cylindrical bars are pulled, which are then sawn into pseudo-square wafer i.e. square wafer with rounded corners. Another known method for manufacturing monocrystalline Silicon-wafer is the Floating-zone or zone melting process, however which leads to similarly high manufacturing costs as the Czochralski method.

A cost-effective method for producing high-volume, substantially monocrystalline silicon blocks is the Vertical-Bridgman method or the Vertical-Gradient-Freeze method. In these known methods, high-purity silicon is melted above 1400° C. in a crucible. By slow cooling of the molten mass, then zones with uniform crystal structure are formed, wherein the solidification process takes place starting from the crucible base. By this method, silicon blocks can be produced with edge-lengths above 70 cm and heights above 30 cm. The silicon blocks are subsequently split into silicon cuboids, which are in turn broken into Silicon-wafers.

It is essential for the production of an extensively monocrystalline silicon block during the solidification process that a large-scale monocrystalline silicon monocrystal seed is provided at the crucible base, which passes down its crystal orientation to the silicon blocks being formed during the solidification of the silicon melt. Such a procedure is suggested, inter alia, in the publication US 2010/0192838 A1. During the crystallization of the silicon melt, the growth surface has a crystal orientation characterized by {100}- according to the Millers index, wherein subsequently, the crystallographic orientation of a surface is specified by {xyz} and the direction by [xyz].

The crystallization on this growth surface is preferred, because then a structuring, a so-called alkali texturing can be carried out on a {100}-crystal surface. Here, microscopic pyramids are formed, which lead to a significant increase in efficiency in the solar-cells because of an improved light input. However, the crystal growth with a [100]-growth direction is highly prone to formation of defects, particularly of dislocation clusters. These dislocation clusters form highly active recombination centers for free charge carriers, which leads to a substantial limitation in their diffusion length and thereby in the efficiency of the silicon solar-cell.

Therefore, it is suggested in the publication DE 10 2010 029 741 A1, to carry out a crystal growth in [110]-direction instead of a crystal growth in [100]-direction. Therefore, in the bottom region of the crucible, a silicon monocrystal seed with a [110]-crystal orientation perpendicular to the crucible base is arranged, which then passes down its crystal orientation to the solidified high-purity silicon. In order to simultaneously provide a textured {100}-wafer surface, the silicon monocrystal seed has a lateral surface with a {100}-crystal orientation parallel to the lateral surface of the crucible. The solidified silicon block is subsequently split into horizontal silicon cuboids and then sawn transverse to the cuboid axis into Silicon-wafer, so that again a {100}-wafer surface results.

The silicon monocrystal seed, which accounts for the unidirectional solidification of the silicon block, is manufactured in a conventional manner by means of the Czochralski- or Floating zone method. In these methods, monocrystalline silicon blocks with a [100]-crystal orientation of the block axis are produced. Since, a block diameter of approx. 40 cm maximum can be produced by the above mentioned method, in order to be able to completely cover the bottom region of the crucible, the silicon monocrystal seed is made of several parts.

In case of the crystal growth method described in the publication DE 10 2010 029 741 A1, in which a seed surface with a {110}-crystal orientation and a lateral surface with a {100}-orientation is necessary, the silicon monocrystal block produced by means of Czochralski- or Floating zone method for seed manufacture is split into tracks, such that the seed surface of these tracks is {110}-oriented. The width of the seeds so produced, naturally, may not be greater than the block diameter. Hence, several seed pieces are laid next to each other for completely covering the base.

However, during the solidification of the high-purity silicon in the crucible, in the region of the edges between the individual parts of the silicon monocrystal seed, there are disturbances in the crystal growth, so that multi crystalline regions are formed here. Hence, during the solidification, the regions of multicrystalline growth most preferably lie in the region of the sawing gaps, whereby the solidified silicon block is then divided into rectangular silicon cuboids, the seed parts are preferably dimensioned according to the width of the cuboids. The silicon monocrystal blocks produced by means of the Czochralski- or Floating-zone melting method are rotated by 45° angle with respect to the block axis and seed plates cut-off parallel to the [100]-crystal orientation, are therefore produced preferably with a width of 157 mm, which corresponds to the standard solar-cell dimension plus the sawing gap, although wherein, a considerable wastage of the very costly seed material, results.

Further, however there is also the problem that during the solidification process in the crucible, even multi-crystalline regions are formed particularly in the upper silicon block region, which extend out laterally above the sawing gap region. Since, the Silicon-wafer can be cut-off from the rectangular silicon cuboid lying perpendicular to the cuboid axis and thereby sawn-off with respect to the abutting edge joints of the seed plates, then there is a risk that a plurality of Silicon-wafers have multi-crystalline regions particularly in the edge region, which then impairs the efficiency of the silicon solar-cells manufactured from the Silicon-wafers. In addition, a cosmetic effect—not to be underestimated—results by the alkaline texture, because the non-monocrystalline regions are hardly textured and thus a blotched appearance of the wafer results.

Therefore, the object of the present invention is to provide a method for manufacturing a silicon monocrystal seed, whereby the usable portion of the silicon monocrystal seed with a {110}-seed surface and with a {100}-orientation of the lateral surface sawn-off from a monocrystalline silicon cuboid, can be increased, and which additionally accounts for that the portion of the substantially monocrystalline Silicon-wafers, which can be cut-off from a solidified silicon block, is increased.

This object is achieved by the following embodiments:
1. Method for manufacturing a silicon monocrystal seed for a Silicon-wafer making,
    in which the silicon monocrystal seed is arranged in the bottom region of a crucible, wherein the silicon monocrystal seed has a seed surface with a {110}-crystal orientation parallel to the bottom region of the crucible,
    in which liquid high-purity silicon is solidified, starting from the seed surface of the silicon monocrystal seed, and
    in which the silicon block is split into Silicon-wafers in such a manner that the wafer surface has a {100}-crystal orientation,
    characterized in that,
    the silicon monocrystal seed is manufactured from a silicon monocrystal block,
    the block axis of which has a [110]-spatial orientation,
    wherein the silicon monocrystal block is split parallel to the block axis for forming the seed surface of the silicon monocrystal seed with the {110}-crystal orientation and a lateral surface of the silicon monocrystal seed with the {100}-crystal orientation.
2. Method according to embodiment 1, characterized in that the silicon monocrystal block for the silicon monocrystal seed is produced by means of Czochralski-method or the Floating zone melting method.
3. Method for manufacturing Silicon-wafers,
    in which a silicon monocrystal seed is arranged in the bottom region of a crucible, wherein the silicon monocrystal seed has a seed surface with a {110}-crystal orientation parallel to the bottom region of the crucible,
    in which liquid high-purity silicon is solidified, starting from the seed surface of the silicon monocrystal seeds, and
    in which the silicon block is split into Silicon-wafers in such a manner that a wafer surface has a {100}-crystal orientation,
characterized in that,
    the silicon monocrystal seed is composed of several tracks, which are manufactured from a silicon monocrystal block, the block axis of which has a [110]-spatial orientation,
    wherein the silicon monocrystal block is cut-off in tracks parallel to the block axis for forming the seed surface of the silicon monocrystal seed with the {110}-crystal orientation and the lateral surface of the silicon monocrystal seed with the {100}-crystal orientation,
    wherein the tracks are combined in order to almost completely cover the bottom region of the crucible,
    wherein during splitting into Silicon-wafers, the silicon block formed in the crucible is divided at first, into rectangular silicon cuboids, the cuboid axis of which respectively extends parallel to the seed surface of the silicon monocrystal seed and perpendicular to the tracks of the silicon monocrystal seed, and then the silicon cuboids are cut-oil across the cuboid axis.
4. Method according to embodiment 3, wherein in at least one, preferably in all tracks, the lateral surface with the {100}-crystal orientation extends undivided over a lateral length of the crucible base (5).
5. Silicon-wafer manufactured by a method according to one of the embodiments 3 or 4.
6. Silicon-wafer according to embodiment 5, characterized in that the {100}-wafer surface is texture-etched by an alkali etching process, wherein the etched wafer surface has pyramid shaped elevations, wherein the edges of the base surface of the pyramid shaped elevations extend parallel to the outer edges of the wafer surface.
7. Silicon-wafer according to embodiment 5 or 6, characterized in that the wafer has a gradient of concentration of carbon, oxygen and/or boron in the silicon over the {100}-wafer surface.
8. Silicon-wafer according to embodiment 5 or 6, characterized in that the wafer has a gradient of the electrical conductivity over the {100}-wafer surface.
9. Silicon solar-cell with a Silicon-wafer according to one of the embodiments 5 to 8, characterized in that, a p/n-junction is configured between the {100}-wafer front- and rear side, wherein the {100}-wafer front-side has a coating and wherein at least the wafer rear-side is provided with contacts.

According to the invention, for manufacturing a silicon monocrystal seed for a Silicon-wafer manufacture, in which the silicon monocrystal seed is arranged in the bottom region of a crucible, wherein the silicon monocrystal seed has the seed surface with a {110}-crystal orientation and the surface normal in [110]-crystal orientation perpendicular to the bottom region of the crucible and the lateral surface with a {100}-crystal orientation parallel to the lateral surface of the crucible, in which the high-purity silicon is melted in the crucible, in which the liquid high-purity silicon is solidified starting from the seed surface of the silicon monocrystal seed, wherein the silicon block being formed takes up the [110]-crystal orientation to a large extent, and in which the silicon block is split into Silicon-wafers in such a manner that the wafer surface has a {100}-crystal orientation, which manufactures the silicon monocrystal seed from a silicon monocrystal block, the block axis of which has a [110]-spatial orientation, wherein the silicon monocrystal block for forming the seed surface of the silicon monocrystal seed is cut-off with a {110}-crystal orientation and the lateral surface of the silicon monocrystal seed is cut-off with a {100}-crystal orientation parallel to the block axis.

By the method in accordance with the invention, optimal silicon monocrystal seed plates for a crucible solidification method can be produced with a {110}-growth surface. Further, the wastage of seed material for manufacturing the seed plates can be reduced on the basis of the crystal growth already carried out in the [110]-direction. This particularly applies, if the costly monocrystalline drawing process, such as the Czochralski- or Floating zone melting methods are employed.

According to the invention, for manufacturing Silicon-wafers, in which the silicon monocrystal seed is arranged in the bottom region of a crucible, wherein the silicon monocrystal seed has a seed surface with a {110}-crystal orientation parallel to the bottom region of the crucible, and an edge surface with a {100}-crystal orientation parallel to the lateral surface of the crucible, in which the high-purity silicon is melted in the crucible, in which the liquid high-purity silicon is solidified starting from the seed surface of the silicon monocrystal seed, wherein the silicon block being formed takes up the {110}-crystal orientation to a large extent, and in which the silicon block is split into Silicon-wafers, in such a manner that the wafer surface has a {100}-crystal orientation, the silicon monocrystal seed is composed of several tracks, which are manufactured from a silicon monocrystal block, the block axis of which has a [110]-spatial orientation, wherein the silicon monocrystal block for forming the seed surface of the silicon monocrystal seed is cut-off into the tracks with a {110}-crystal orientation and the lateral surface of the silicon monocrystal seed is cut-off with a {100}-crystal orientation parallel to the block axis, wherein the tracks are combined in order to almost completely cover the bottom region of the crucible, wherein during splitting into Silicon-wafers, the silicon block formed in the crucible, at first, splits into rectangular silicon cuboid, the cuboid axis of which respectively extends parallel to the seed surface of the silicon monocrystal seed and perpendicular to the tracks of the silicon monocrystal seed, and then the silicon cuboid is cut-off transverse to the cuboid axis.

The method in accordance with the invention is characterized by a high proportion of almost monocrystalline Silicon-wafers after sawing of the solidified silicon block. During the splitting of the silicon block into horizontal rectangular silicon cuboids, the transverse axis extends perpendicular to the abutting surfaces of the silicon monocrystal seed tracks. This in turn results in that the Silicon-wafers, into which the silicon cuboids are then split, are oriented parallel to the abutting surfaces of the seed tracks. The irregular growth patterns, preferably forming in the region of the abutting surfaces of the seed tracks during the solidification process in the crucible, which then leads to multi-crystalline regions in the solidified silicon block, are then concentrated on individual wafers during splitting of the silicon block, namely on the wafers which were cut-off directly above the abutting surfaces, so that the proportion of the substantially completely monocrystalline Silicon-wafers, which are cut-off from a solidified silicon block, substantially increases in comparison to the method suggested in the publication DE 10 2010 029 741 A1. In addition, during the production of the seed tracks with a limitation of the seed tracks on the standard silicon solar-cell dimension of 157 mm, may be dispensed with and hence, wider and narrower tracks can be cut-off from the silicon monocrystal cuboid for forming the seeds, whereby the wastage of costly seed material can additionally be reduced.

The invention is explained in more details with the help of the accompanying drawings. They show:

Figure 5:
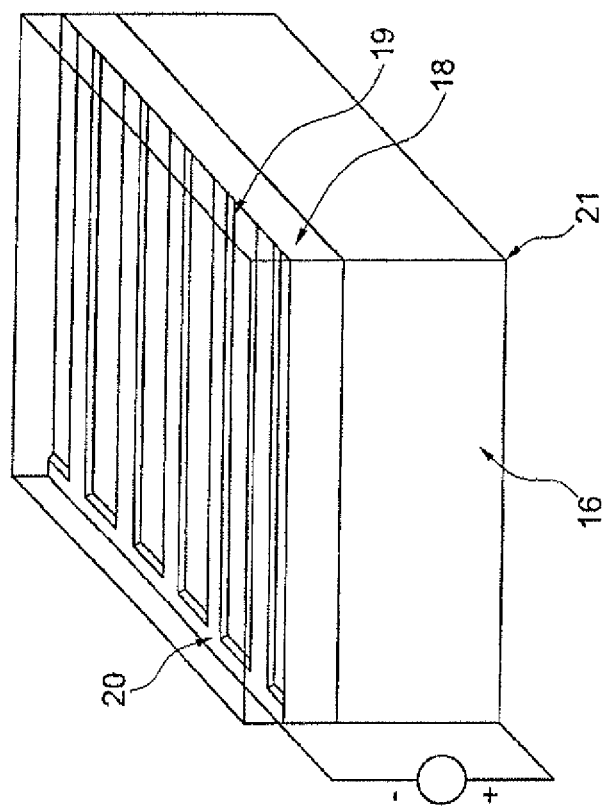

FIG. 5 schematically shows a principle structure of a monocrystalline silicon solar-cell.

Figure 1:
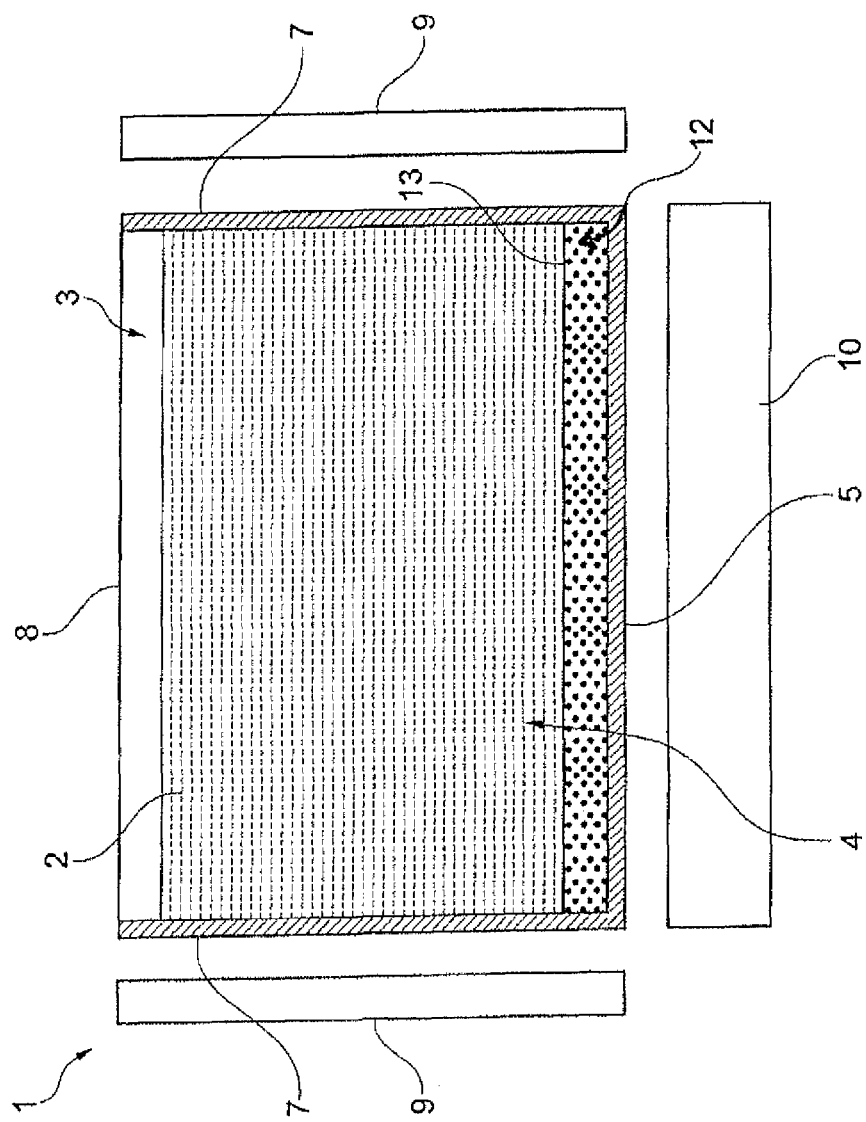
FIG. 1 shows a schematic side sectional representation of a device for melting and crystallizing silicon blocks by using a silicon monocrystal seed in the bottom region.

By the device 1 schematically shown in FIG. 1 for melting and crystallizing high-purity silicon, high-quality, monocrystalline silicon blocks may be produced. Therefore, the block dimensions may have an edge length of 70 cm and above, and a block height of 30 cm and above. However, the block height may also be selected smaller and for example, the length of outer edge of 157 mm of a standard silicon solar-cell additionally corresponds to the base- and cap-sections, not used for the solar-cells.

The device for melting and crystallizing high-purity silicon has a crucible 3, which has substantially the shape of a cuboid open upwards. The interior space 4 of the crucible 3 is confined from five sides and consists of a base 5 and four side walls 7. The interior space 4 of the crucible 3 can be filled via an opening 8 located opposite the base 5. On the outer side of the crucible 3, heating elements 9 and cooling elements 10 are arranged, whereby the interior space 4 of the crucible 3 may be selectively heated or cooled.

Figure 2:
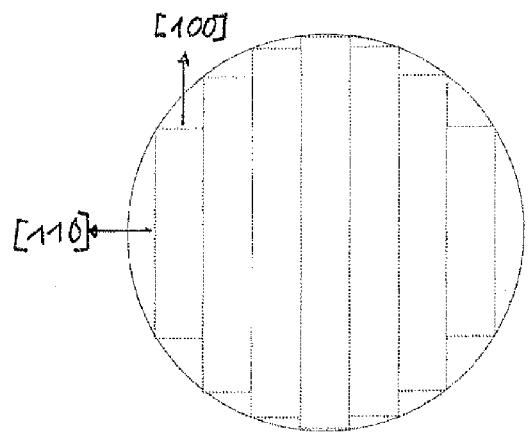
FIG. 2 shows a cross-section through a silicon monocrystal cuboid for forming a silicon monocrystal seed composed of tracks.

For manufacturing a monocrystalline silicon block made of high-purity silicon, the silicon monocrystal seed 12 is arranged on the base 5 of the crucible 3. The silicon monocrystal seed 12 is manufactured from a silicon monocrystal bar, which is preferably produced by the Czochralski- or Floating zone melting method. Therefore, the manufacture of the monocrystalline silicon bar takes place out of a silicon melt, in which a seed crystal serving as a crystallization seed is immersed. Then, by slow controlled lifting under rotation, a monocrystalline silicon block with a diameter of up to approx. 30 cm and a height of up to 2 m is formed. FIG. 2 shows a cross-section through a silicon block produced by the Czochralski-method.

For manufacturing a monocrystalline silicon block, as shown in FIG. 1, the crucible 3 with the silicon monocrystal seed 12 covering the base 5, is filled with liquid high-purity (electronic grade) silicon 2 via the crucible opening 8. Instead of liquid high-purity silicon 2, powdered, granular or lumpy silicon may also be used, which is then melted by the heating elements 9 on the crucible. Subsequently, the silicon monocrystal seed 12 is melted on the seed surface 13 at the base 5 of the crucible 3. Then, by a corresponding temperature control by means of the heating elements 9 or cooling elements 10, the liquid high-purity silicon 2 is solidified on the silicon monocrystal seed 12. Therefore, the solidification process takes place, starting from the seed surface 13 of the silicon monocrystal seed 12 upwards, wherein the seed surface of the silicon monocrystal seed passes down its crystal orientation to the forming silicon block.

The silicon monocrystal seed 12 is formed such that the seed surface 13 has a {110}-crystal orientation and a surface normal in [110]-direction perpendicular to the base 5 of the crucible 3. Further, the silicon monocrystal seed 12 has a lateral surface with a {100}-crystal orientation parallel to a lateral surface 7 of the crucible 3. Because of this layout of the silicon monocrystal seed, the crystal growth of the silicon block on the silicon monocrystal seed takes place on a {110}-growth surface, which is less susceptible to formation of dislocations, whereby a high crystal quality results in the solidified silicon block. The {100}-lateral surface of the silicon monocrystal seeds further ensures that the silicon block being solidified on the silicon monocrystal seed 12, similarly configures such a {100}-surface, which can then effectively be textured alkaline after the division of the silicon block into Silicon-wafers.

Figure 3:
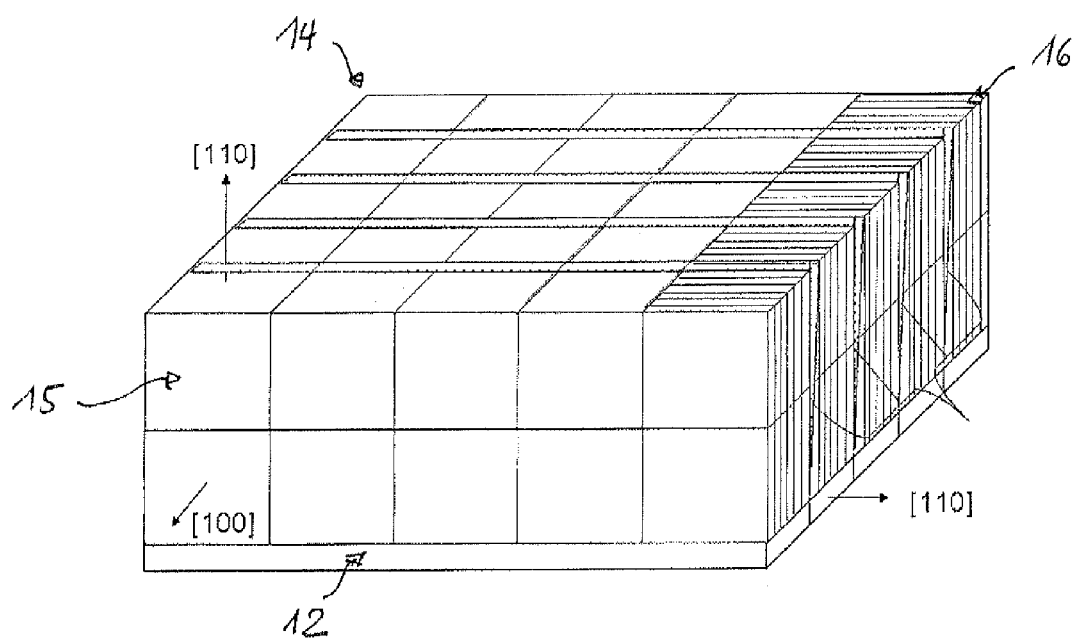
FIG. 3 shows a silicon block manufactured by the device shown in FIG. 1, by using tracks made of silicon monocrystal seeds in the bottom region, wherein the solidified silicon blocks are divided into horizontal rectangular silicon cuboids and these are in turn divided into Silicon-wafers.

FIG. 3 shows a silicon block 14, which was produced by the device 1 represented in the FIG. 1 and which has a growth surface with a {110}-crystal orientation and a lateral surface with a {100}-crystal orientation. Therefore, the silicon block 14 has a width of 78.5 cm and a height of 31.4 cm. However, it may also be formed in a different block dimension. During the manufacture of the Silicon-wafer, the silicon block 14 is sawn preferably into square cuboid 15, wherein the cuboid 15 preferably has an area of 156×156 mm$^2$, which corresponds to the standard silicon solar-cell dimension. During the manufacture of the silicon cuboid 15, as shown in FIG. 3, the silicon block 14 is subdivided perpendicular to the {110}-growth surface and perpendicular to the {100}-lateral surface of the silicon block. Therefore, preferably it is proceeded such that a first section is carried out perpendicular to the {110}-growth surface and parallel to the {110}-lateral surface of the silicon block 14 and a second section is carried out perpendicular to the {100}-lateral surface and perpendicular to the {110}-lateral surface of the silicon block 14. In the silicon block 14 shown in FIG. 3, thus two rows of five silicon monocrystal cuboids 15, lying one over the other, are produced.

As explained previously, the silicon monocrystal seed made of monocrystalline silicon bars produced by the Czochralski- or Floating zone melting method, are sawn out with higher purity and more perfect crystal structure. Because of the limited cuboid diameter, it is necessary for combining this out of several parts for forming a silicon monocrystal seed for completely covering the base 5 of the crucible 3. Therefore, the silicon monocrystal seed 12 has a thickness of one or more centimeters, preferably 2 cm, wherein the seed surface must have a {110}-crystal orientation parallel to the bottom surface of the crucible. At the same time, it must be ensured that the lateral surface of the silicon monocrystal seed or of the individual parts has a {100}-crystal orientation.

In order to produce such a silicon monocrystal seeds, the monocrystalline silicon block manufactured by the Czochralski- or Floating zone melting method, is configured with a block axis which has a [110]-spatial orientation. For producing the silicon monocrystal seed, as shown in FIG. 2, then the silicon monocrystal block is cut-off in tracks parallel to the block axis, wherein the individual tracks have a thickness corresponding to the desired silicon monocrystal seed thickness of one to several centimeters, preferably 2 cm. The individual tracks have, as FIG. 2 shows further, a surface with a {110}-crystal orientation, which serves as seed surface, and a longitudinal lateral surface with a {100}-crystal orientation.

Then, as shown in FIG. 3, for producing silicon block 14 and cut-off from the silicon monocrystal block, the tracks of the silicon monocrystal seeds 12 are laid over the base 5 of the crucible 3, such that the crucible base is almost completely covered, wherein the longitudinal lateral surface tracks extend with a {100}-crystal orientation along a crucible side. As further represented in FIG. 3, the solidified silicon block 14 is sawn in the horizontal rectangular silicon cuboid 15, such that the cuboid axes extend perpendicular to the tracks of the silicon monocrystal seed 12. The Silicon-wafer 16 are in turn produced from the individual rectangular silicon cuboid 15 by sawing parallel to the {100}-cuboid surface. Therefore, the thickness of the Silicon-wafer 16 is defined according to the desired application or construction of the silicon solar-cell to be manufactured therefrom.

By the selected arrangement of the silicon monocrystal seeds in the form of tracks, which cover the crucible base across the {100}-lateral surface, it is achieved that during splitting of the horizontal rectangular silicon cuboids 15 of the silicon block 14, only a small number of wafers are manufactured, which are located in the region above the abutting surfaces between the tracks of the silicon monocrystal seed. During the solidification process of the silicon block, particularly in regions over the abutting surfaces, there is a risk of formation of multi-crystalline sections in the silicon block, which then lead to a reduced efficiency and optical errors, in the solar-cells which are made from the Silicon-wafers sawn out of the silicon block. With the above procedure, such Silicon-wafers with multi-crystalline regions, which are formed in the region of the abutting surfaces between the tracks of the silicon monocrystal seed, are separated from the remaining, almost perfect monocrystalline silicon solar-cells.

The production of the silicon monocrystal seed 12 made of several tracks, which are cut-off from a silicon block, the block axis of which was formed with a [110]-spatial orientation, has in addition the advantage, as shown in FIG. 2, that substantially the complete monocrystalline silicon block can be used for seed track formation, whereby the wastage of very costly seed material can largely be avoided. At the same time, by cutting-off the monocrystalline silicon block parallel to the block axis, tracks of length corresponding to the side length of the crucible can be configured.

Figure 4:
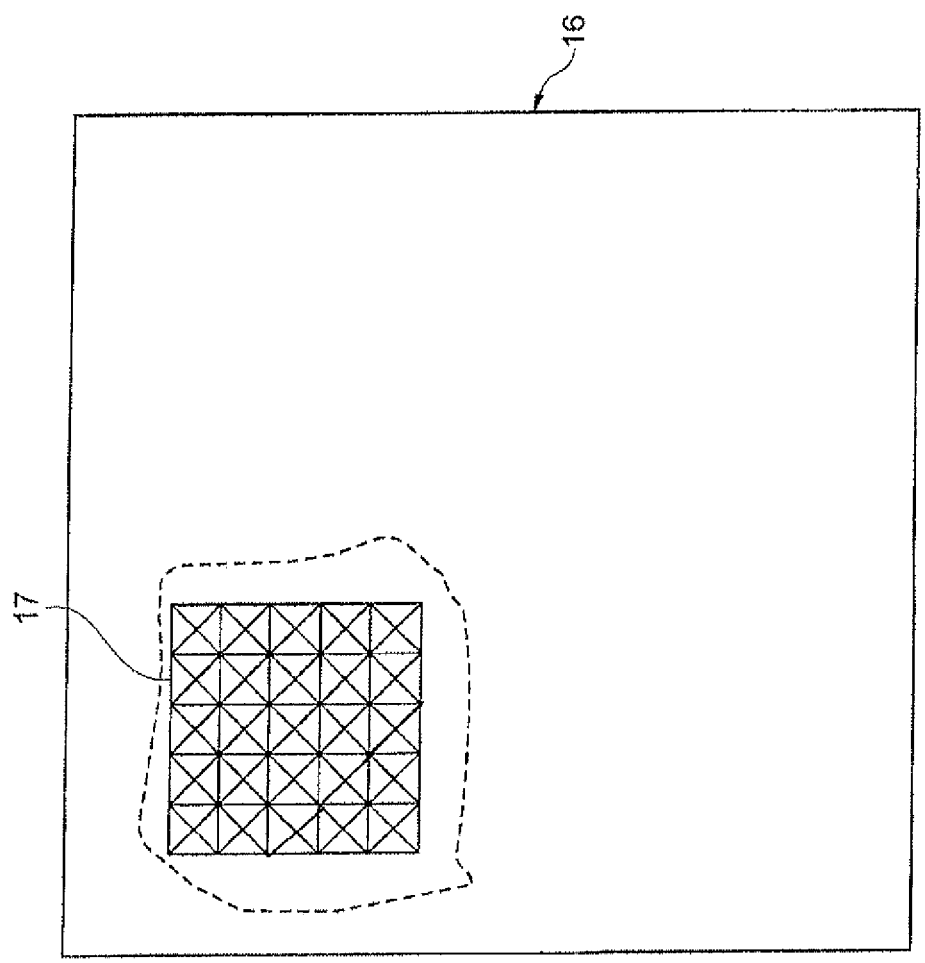
FIG. 4 shows a Silicon-wafer with a textured wafer surface.

Within the scope of the silicon block formation by controlled solidification of high-purity silicon, various distributions of carbon-, oxygen- and/or boron may be obtained, e.g. in order to vary the conductivity in the silicon block in the direction of growth, that is, in the direction of the [110]-crystal orientation. For further processing of the Silicon-wafer 16 into solar-cells, preferably chemically in a first step, the sawing damages which result during the splitting of the rectangular silicon monocrystal cuboids, are eliminated. Associated with the removal of the saw damages on the {100}-wafer surface, in addition, a structuring, the so-called texturing is carried out, which accounts for an improved light input by reducing the feedback losses and thereby accounts for an increase in the solar-cell efficiency. The wafer texturing, which is preferably affected by wet- or dry-chemical etching process, preferably with an alkaline monotexture on the wafer surface, as is shown in FIG. 4 in a section, then accounts for a pyramid structure 17. Therefore, the edges of the base surface of the pyramid shaped elevations 17 extend parallel to the outer edges of the Silicon-wafer surface.

Within the scope of the further formation of the Silicon-wafer 16 into a solar-cell, a p-n-junction 18 is produced by a doping, preferably a Phosphorous doping, after carrying out the texturing in the wafer. Subsequently, the Silicon-wafer surface is then compensated, preferably by introduction of an anti-reflection coating 19. Then in a final step, the front- and rear-side contacts 20, 21 are introduced on the Silicon-wafer, in order to complete the silicon solar-cell.

The invention claimed is:
1. Method for manufacturing Silicon-wafers,
in which a silicon monocrystal seed is arranged in the bottom region of a crucible, wherein the silicon monocrystal seed has a seed surface with a {110}-crystal orientation parallel to the bottom region of the crucible,
in which liquid high-purity silicon is solidified, starting from the seed surface of the silicon monocrystal seeds, thereby forming a silicon block, and
in which the silicon block is split into Silicon-wafers in such a manner that a wafer surface has a {100}-crystal orientation,
wherein,
the silicon monocrystal seed is composed of several tracks, which are manufactured from a silicon monocrystal block, the block axis of which has a [110]-spatial orientation,
wherein the silicon monocrystal block is cut-off in tracks parallel to the block axis for forming the seed surface of the silicon monocrystal seed with the {110}-crystal orientation and the lateral surface of the silicon monocrystal seed with the {100}-crystal orientation,
wherein the tracks are combined in order to almost completely cover the bottom region of the crucible,
wherein during splitting into Silicon-wafers, the silicon block formed in the crucible is divided at first, into rectangular silicon cuboids, the cuboid axis of which respectively extends parallel to the seed surface of the silicon monocrystal seed and perpendicular to the tracks of the silicon monocrystal seed, and then the silicon cuboids are cut-off across the cuboid axis.

2. Method according to claim 1, wherein the silicon monocrystal block for the silicon monocrystal seed is produced by means of Czochralski-method or the Floating zone melting method.

3. Method according to claim 1, wherein in at least one track, the lateral surface with the {100}-crystal orientation extends undivided over a lateral length of the crucible base.

4. Silicon-wafer manufactured by a method according to claim 1.

5. Silicon-wafer according to claim 4, wherein the {100}-wafer surface is texture-etched by an alkali etching process, wherein the etched wafer surface has pyramid shaped elevations, wherein the edges of the base surface of the pyramid shaped elevations extend parallel to the outer edges of the wafer surface.

6. Silicon-wafer according to claim 4, wherein the wafer has a gradient of concentration of carbon, oxygen and/or boron in the silicon over the {100}-wafer surface.

7. Silicon-wafer according to claim 4, wherein the wafer has a gradient of the electrical conductivity over the {100}-wafer surface.

8. Silicon solar-cell with a Silicon-wafer according to claim 4, wherein a p/n-junction is configured between the {100}-wafer front- and rear side, wherein the {100}-wafer front-side has a coating and wherein at least the wafer rear-side is provided with contacts.

9. Method according to claim 1, wherein in all tracks, the lateral surface with the {100}-crystal orientation extends undivided over a lateral length of the crucible base.

10. Method according to claim 1, wherein the silicon block has an edge length of at least 70 cm and a block height of at least 30 cm.

11. Method according to claim 1, wherein the silicon monocrystal seed has a thickness of at least 1 cm.

* * * * *